United States Patent
Nystrom et al.

(10) Patent No.: US 9,548,145 B2
(45) Date of Patent: Jan. 17, 2017

(54) MICROELECTRONIC ASSEMBLY WITH MULTI-LAYER SUPPORT STRUCTURE

(71) Applicant: Invensas Corporation, San Jose, CA (US)

(72) Inventors: Michael J. Nystrom, San Jose, CA (US); Giles Humpston, Buckinghamshire (GB)

(73) Assignee: Invensas Corporation, San Jose, CA (US)

( * ) Notice: Subject to any disclaimer, the term of this patent is extended or adjusted under 35 U.S.C. 154(b) by 302 days.

(21) Appl. No.: 14/096,906

(22) Filed: Dec. 4, 2013

(65) Prior Publication Data

US 2014/0224419 A1 Aug. 14, 2014

Related U.S. Application Data

(62) Division of application No. 11/650,356, filed on Jan. 5, 2007, now Pat. No. 8,604,605.

(51) Int. Cl.
    *H01L 23/10* (2006.01)
    *H01B 13/00* (2006.01)

(52) U.S. Cl.
    CPC ............. *H01B 13/00* (2013.01); *H01L 23/10* (2013.01); *H01L 2224/48091* (2013.01); *H01L 2224/48463* (2013.01); *Y10T 29/49126* (2015.01); *Y10T 156/1062* (2015.01); *Y10T 156/1092* (2015.01)

(58) Field of Classification Search
    CPC ........... H01L 2224/48091; H01L 23/10; H01B 13/00; Y10T 156/1062; Y10T 156/1092; Y10T 29/49126
    USPC ........................................................ 156/299
    See application file for complete search history.

(56) References Cited

U.S. PATENT DOCUMENTS

| | | |
|---|---|---|
| 2,507,956 A | 5/1950 | Bruno et al. |
| 2,796,370 A | 6/1957 | Ostrander et al. |
| 2,851,385 A | 9/1958 | Spruance et al. |
| 3,648,131 A | 3/1972 | Stuby |
| 3,761,782 A | 9/1973 | Youmans |
| 3,981,023 A | 9/1976 | King et al. |
| 4,259,679 A | 3/1981 | Knibb et al. |
| 4,279,690 A | 7/1981 | Dierschke |
| 4,339,689 A | 7/1982 | Yamanaka et al. |
| 4,551,629 A | 11/1985 | Carson et al. |
| 4,558,171 A | 12/1985 | Gantley et al. |
| 4,764,846 A | 8/1988 | Go |
| 4,768,077 A | 8/1988 | Scherer |
| 4,774,630 A | 9/1988 | Reisman et al. |
| 4,794,092 A | 12/1988 | Solomon |
| 4,797,179 A | 1/1989 | Watson et al. |
| 4,806,106 A | 2/1989 | Mebane et al. |
| 4,812,420 A | 3/1989 | Matsuda et al. |
| 4,825,284 A | 4/1989 | Soga et al. |
| 4,827,376 A | 5/1989 | Voss |
| 4,862,197 A | 8/1989 | Stoffel |
| 4,862,249 A | 8/1989 | Carlson |
| 4,894,707 A | 1/1990 | Yamawaki et al. |
| 4,933,601 A | 6/1990 | Sagawa et al. |
| 4,984,358 A | 1/1991 | Nelson |
| 5,070,297 A | 12/1991 | Kwon et al. |
| 5,072,520 A | 12/1991 | Nelson |
| 5,104,820 A | 4/1992 | Go et al. |
| 5,118,924 A | 6/1992 | Mehra et al. |
| 5,124,543 A | 6/1992 | Kawashima |
| 5,126,286 A | 6/1992 | Chance |
| 5,139,972 A | 8/1992 | Neugebauer et al. |
| 5,148,265 A | 9/1992 | Khandros et al. |
| 5,148,266 A | 9/1992 | Khandros et al. |
| 5,177,753 A | 1/1993 | Tanaka |
| 5,187,122 A | 2/1993 | Bonis |
| 5,198,963 A | 3/1993 | Gupta et al. |
| 5,220,838 A | 6/1993 | Fung et al. |
| 5,250,462 A | 10/1993 | Sasaki et al. |
| 5,266,501 A | 11/1993 | Imai |
| 5,266,833 A | 11/1993 | Capps |
| 5,285,352 A | 2/1994 | Pastore et al. |
| 5,321,303 A | 6/1994 | Kawahara et al. |
| 5,335,210 A | 8/1994 | Bernstein |
| 5,347,159 A | 9/1994 | Khandros et al. |
| 5,382,829 A | 1/1995 | Inoue |
| 5,390,844 A | 2/1995 | Distefano et al. |
| 5,398,863 A | 3/1995 | Grube et al. |
| 5,438,305 A | 8/1995 | Hikita et al. |
| 5,448,014 A | 9/1995 | Kong et al. |
| 5,473,190 A | 12/1995 | Inoue et al. |
| 5,486,720 A | 1/1996 | Kierse et al. |
| 5,491,302 A | 2/1996 | Distefano et al. |
| 5,500,540 A | 3/1996 | Jewell et al. |

(Continued)

FOREIGN PATENT DOCUMENTS

| | | |
|---|---|---|
| EP | 0 506 491 | 9/1992 |
| EP | 0 585 186 A | 3/1994 |

(Continued)

OTHER PUBLICATIONS

U.S. Appl. No. 10/077,388, filed Feb. 15, 2002, assigned to Tessera, Inc., now Abandoned.

(Continued)

*Primary Examiner* — Philip Tucker
*Assistant Examiner* — Jimmy R Smith, Jr.
(74) *Attorney, Agent, or Firm* — Lerner, David, Littenberg, Krumholz & Mentlik, LLP

(57) ABSTRACT

A method of forming a microelectronic assembly includes positioning a support structure adjacent to an active region of a device but not extending onto the active region. The support structure has planar sections. Each planar section has a substantially uniform composition. The composition of at least one of the planar sections differs from the composition of at least one of the other planar sections. A lid is positioned in contact with the support structure and extends over the active region. The support structure is bonded to the device and to the lid.

6 Claims, 5 Drawing Sheets

(56) References Cited

U.S. PATENT DOCUMENTS

| | | |
|---|---|---|
| 5,504,035 A | 4/1996 | Rostoker et al. |
| 5,518,964 A | 5/1996 | DiStefano et al. |
| 5,526,449 A | 6/1996 | Meade et al. |
| 5,530,288 A | 6/1996 | Stone |
| 5,536,909 A | 7/1996 | DiStefano et al. |
| 5,546,654 A | 8/1996 | Wojnarowski et al. |
| 5,557,501 A | 9/1996 | DiStefano et al. |
| 5,567,657 A | 10/1996 | Wojnarowski et al. |
| 5,576,680 A | 11/1996 | Ling |
| 5,578,874 A | 11/1996 | Kurogi et al. |
| 5,593,632 A * | 1/1997 | Kagawa ............ B01D 67/0027 264/284 |
| 5,595,930 A | 1/1997 | Baek |
| 5,608,262 A | 3/1997 | Degani et al. |
| 5,610,431 A | 3/1997 | Martin |
| 5,612,570 A | 3/1997 | Eide et al. |
| 5,629,239 A | 5/1997 | DiStefano et al. |
| 5,629,241 A | 5/1997 | Matloubian et al. |
| 5,633,785 A | 5/1997 | Parker et al. |
| 5,642,261 A | 6/1997 | Bond et al. |
| 5,657,206 A | 8/1997 | Pedersen et al. |
| 5,659,952 A | 8/1997 | Kovac et al. |
| 5,661,087 A | 8/1997 | Pedersen et al. |
| 5,668,033 A | 9/1997 | Ohara et al. |
| 5,672,519 A | 9/1997 | Song et al. |
| 5,675,180 A | 10/1997 | Pedersen et al. |
| 5,677,200 A | 10/1997 | Park et al. |
| 5,677,569 A | 10/1997 | Choi et al. |
| 5,679,977 A | 10/1997 | Khandros et al. |
| 5,688,716 A | 11/1997 | DiStefano et al. |
| 5,703,400 A | 12/1997 | Wojnarowski et al. |
| 5,705,858 A | 1/1998 | Tsukamoto |
| 5,706,174 A | 1/1998 | Distefano et al. |
| 5,707,174 A | 1/1998 | Garren |
| 5,717,245 A | 2/1998 | Pedder et al. |
| 5,734,196 A | 3/1998 | Horton et al. |
| 5,744,752 A | 4/1998 | McHerron et al. |
| 5,747,870 A | 5/1998 | Pedder et al. |
| 5,757,074 A | 5/1998 | Matloubian et al. |
| 5,766,987 A | 6/1998 | Mitchell et al. |
| 5,787,581 A | 8/1998 | DiStefano et al. |
| 5,798,286 A | 8/1998 | Faraci et al. |
| 5,798,557 A | 8/1998 | Salatino et al. |
| 5,801,474 A | 9/1998 | Sakairi |
| 5,814,894 A | 9/1998 | Igarashi et al. |
| 5,817,541 A | 10/1998 | Averkiou et al. |
| 5,821,609 A | 10/1998 | DiStefano et al. |
| 5,830,782 A | 11/1998 | Smith et al. |
| 5,837,562 A | 11/1998 | Cho |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,869,887 A | 2/1999 | Urushima |
| 5,869,894 A | 2/1999 | Degani et al. |
| 5,872,697 A | 2/1999 | Christensen et al. |
| 5,886,393 A | 3/1999 | Merrill et al. |
| 5,888,884 A | 3/1999 | Wojnarowski |
| 5,891,761 A | 4/1999 | Vindasius et al. |
| 5,892,417 A | 4/1999 | Johnson et al. |
| 5,895,233 A | 4/1999 | Higashi et al. |
| 5,895,972 A | 4/1999 | Paniccia |
| 5,900,674 A | 5/1999 | Wojnarowski et al. |
| 5,905,639 A | 5/1999 | Warren |
| 5,909,052 A | 6/1999 | Ohta et al. |
| 5,910,687 A | 6/1999 | Chen et al. |
| 5,913,109 A | 6/1999 | Distefano et al. |
| 5,915,168 A | 6/1999 | Salatino et al. |
| 5,915,752 A | 6/1999 | DiStefano et al. |
| 5,918,112 A | 6/1999 | Shah et al. |
| 5,920,142 A | 7/1999 | Onishi et al. |
| 5,926,380 A | 7/1999 | Kim |
| 5,929,517 A | 7/1999 | Distefano et al. |
| 5,938,452 A | 8/1999 | Wojnarowski |
| 5,952,712 A | 9/1999 | Ikuina et al. |
| 5,965,933 A | 10/1999 | Young et al. |
| 5,973,391 A | 10/1999 | Bischoff et al. |
| 5,976,913 A | 11/1999 | Distefano et al. |
| 5,985,695 A | 11/1999 | Freyman et al. |
| 5,986,746 A | 11/1999 | Metz et al. |
| 5,991,989 A | 11/1999 | Onishi et al. |
| 5,993,981 A | 11/1999 | Askinazi et al. |
| 6,002,163 A | 12/1999 | Wojnarowski |
| 6,005,466 A | 12/1999 | Pedder |
| 6,011,330 A | 1/2000 | Goodman et al. |
| 6,020,217 A | 2/2000 | Kuisl et al. |
| 6,037,659 A | 3/2000 | Weixel |
| 6,040,235 A | 3/2000 | Badehi |
| 6,046,076 A | 4/2000 | Mitchell et al. |
| 6,046,410 A | 4/2000 | Wojnarowski et al. |
| 6,049,470 A | 4/2000 | Weale |
| 6,049,972 A | 4/2000 | Link et al. |
| 6,054,756 A | 4/2000 | DiStefano et al. |
| 6,072,236 A | 6/2000 | Akram et al. |
| 6,075,289 A | 6/2000 | Distefano |
| 6,080,596 A | 6/2000 | Vindasius et al. |
| 6,081,035 A | 6/2000 | Warner et al. |
| 6,092,280 A | 7/2000 | Wojnarowski |
| 6,093,888 A | 7/2000 | Laureanti et al. |
| 6,094,138 A | 7/2000 | Eberhardt et al. |
| 6,098,278 A | 8/2000 | Vindasius et al. |
| 6,100,594 A | 8/2000 | Fukui et al. |
| 6,104,272 A | 8/2000 | Yamamoto et al. |
| 6,121,676 A | 9/2000 | Solberg |
| 6,122,009 A | 9/2000 | Ueda et al. |
| 6,124,179 A | 9/2000 | Adamic, Jr. |
| 6,124,546 A | 9/2000 | Hayward et al. |
| 6,124,637 A | 9/2000 | Freyman et al. |
| 6,133,626 A | 10/2000 | Hawke et al. |
| 6,134,118 A | 10/2000 | Pedersen et al. |
| 6,140,144 A | 10/2000 | Najafi et al. |
| 6,156,652 A | 12/2000 | Michalicek |
| 6,156,980 A | 12/2000 | Peugh et al. |
| 6,165,814 A | 12/2000 | Wark et al. |
| 6,169,328 B1 | 1/2001 | Mitchell et al. |
| 6,181,015 B1 | 1/2001 | Gotoh et al. |
| 6,194,774 B1 | 2/2001 | Cheon et al. |
| 6,214,644 B1 | 4/2001 | Glenn |
| 6,218,729 B1 | 4/2001 | Zavrel, Jr. et al. |
| 6,221,751 B1 | 4/2001 | Chen et al. |
| 6,225,688 B1 | 5/2001 | Kim et al. |
| 6,225,694 B1 | 5/2001 | Terui |
| 6,228,686 B1 | 5/2001 | Smith et al. |
| 6,229,200 B1 | 5/2001 | McLellan et al. |
| 6,229,427 B1 | 5/2001 | Kurtz et al. |
| 6,235,141 B1 | 5/2001 | Feldman et al. |
| 6,238,949 B1 | 5/2001 | Nguyen et al. |
| 6,238,950 B1 | 5/2001 | Howser et al. |
| 6,249,039 B1 | 6/2001 | Harvey et al. |
| 6,252,778 B1 | 6/2001 | Tonegawa et al. |
| 6,255,714 B1 | 7/2001 | Kossives et al. |
| 6,261,945 B1 | 7/2001 | Nye, III et al. |
| 6,265,246 B1 | 7/2001 | Ruby et al. |
| 6,265,763 B1 | 7/2001 | Jao et al. |
| 6,274,937 B1 | 8/2001 | Ahn et al. |
| 6,279,227 B1 | 8/2001 | Khandros et al. |
| 6,281,570 B1 | 8/2001 | Kameyama et al. |
| 6,285,064 B1 | 9/2001 | Foster |
| 6,292,086 B1 | 9/2001 | Chu |
| 6,297,551 B1 | 10/2001 | Dudderar et al. |
| 6,309,910 B1 | 10/2001 | Haba et al. |
| 6,310,386 B1 | 10/2001 | Shenoy |
| 6,316,840 B1 | 11/2001 | Otani et al. |
| 6,321,444 B1 | 11/2001 | Yatsuda et al. |
| 6,323,735 B1 | 11/2001 | Welland et al. |
| 6,326,689 B1 | 12/2001 | Thomas |
| 6,326,696 B1 | 12/2001 | Horton et al. |
| 6,326,697 B1 | 12/2001 | Farnworth |
| 6,329,715 B1 | 12/2001 | Hayashi et al. |
| 6,342,406 B1 | 1/2002 | Glenn et al. |
| 6,344,688 B1 | 2/2002 | Wang |
| 6,353,263 B1 | 3/2002 | Dotta et al. |
| 6,362,525 B1 | 3/2002 | Rahim |

(56) References Cited

U.S. PATENT DOCUMENTS

| | | |
|---|---|---|
| 6,366,629 B1 | 4/2002 | Chen et al. |
| 6,368,896 B2 | 4/2002 | Farnworth et al. |
| 6,373,130 B1 | 4/2002 | Salaville |
| 6,376,279 B1 | 4/2002 | Kwon et al. |
| 6,377,464 B1 | 4/2002 | Hashemi et al. |
| 6,384,397 B1 | 5/2002 | Takiar et al. |
| 6,387,747 B1 | 5/2002 | Cha et al. |
| 6,387,793 B1 | 5/2002 | Yap et al. |
| 6,396,043 B1 | 5/2002 | Glenn et al. |
| 6,396,116 B1 | 5/2002 | Kelly et al. |
| 6,396,470 B1 | 5/2002 | Zhang et al. |
| 6,403,400 B2 | 6/2002 | Lin et al. |
| 6,404,131 B1 | 6/2002 | Kawano et al. |
| 6,420,208 B1 | 7/2002 | Pozder et al. |
| 6,429,036 B1 | 8/2002 | Nixon et al. |
| 6,429,511 B2 | 8/2002 | Ruby et al. |
| 6,441,481 B1 | 8/2002 | Karpman |
| 6,449,828 B2 | 9/2002 | Pahl et al. |
| 6,452,238 B1 | 9/2002 | Orcutt et al. |
| 6,459,150 B1 | 10/2002 | Wu et al. |
| 6,472,727 B2 | 10/2002 | Miyazaki et al. |
| 6,480,389 B1 | 11/2002 | Shie et al. |
| 6,483,179 B2 | 11/2002 | Iizima et al. |
| 6,492,194 B1 | 12/2002 | Bureau et al. |
| 6,492,201 B1 | 12/2002 | Haba |
| 6,493,231 B2 | 12/2002 | Nicholson et al. |
| 6,493,240 B2 | 12/2002 | Broglia et al. |
| 6,493,861 B1 | 12/2002 | Li et al. |
| 6,498,099 B1 | 12/2002 | McLellan et al. |
| 6,498,381 B2 | 12/2002 | Halahan et al. |
| 6,521,987 B1 | 2/2003 | Glenn et al. |
| 6,534,340 B1 | 3/2003 | Karpman et al. |
| 6,548,911 B2 | 4/2003 | Yu et al. |
| 6,550,664 B2 | 4/2003 | Bradley et al. |
| 6,552,475 B2 | 4/2003 | Hori et al. |
| 6,555,901 B1 | 4/2003 | Yoshihara et al. |
| 6,562,647 B2 | 5/2003 | Zandman et al. |
| 6,569,710 B1 | 5/2003 | Pierson |
| 6,583,444 B2 | 6/2003 | Fjelstad |
| 6,583,513 B1 | 6/2003 | Utagikar et al. |
| 6,596,634 B2 | 7/2003 | Umetsu et al. |
| 6,607,941 B2 | 8/2003 | Prabhu et al. |
| 6,614,660 B1 | 9/2003 | Bai et al. |
| 6,621,163 B2 | 9/2003 | Weekamp et al. |
| 6,624,505 B2 | 9/2003 | Badehi |
| 6,627,864 B1 | 9/2003 | Glenn et al. |
| 6,627,985 B2 | 9/2003 | Huppenthal et al. |
| 6,627,998 B1 | 9/2003 | Caletka et al. |
| 6,646,289 B1 | 11/2003 | Badehi |
| 6,656,827 B1 | 12/2003 | Tsao et al. |
| 6,657,296 B2 | 12/2003 | Ho et al. |
| 6,664,624 B2 | 12/2003 | Haematsu |
| 6,670,206 B2 | 12/2003 | Kim et al. |
| 6,670,215 B2 | 12/2003 | Miyazaki et al. |
| 6,674,159 B1 | 1/2004 | Peterson et al. |
| 6,678,167 B1 | 1/2004 | Degani et al. |
| 6,693,361 B1 | 2/2004 | Siniaguine et al. |
| 6,699,730 B2 | 3/2004 | Kim et al. |
| 6,710,456 B1 | 3/2004 | Jiang et al. |
| 6,713,856 B2 | 3/2004 | Tsai et al. |
| 6,717,254 B2 | 4/2004 | Siniaguine |
| 6,734,040 B2 | 5/2004 | Yamaguchi et al. |
| 6,744,109 B2 | 6/2004 | Barton et al. |
| 6,753,205 B2 | 6/2004 | Halahan |
| 6,764,875 B2 | 7/2004 | Shook |
| 6,768,190 B2 | 7/2004 | Yang et al. |
| 6,784,020 B2 | 8/2004 | Lee et al. |
| 6,787,916 B2 | 9/2004 | Halahan |
| 6,798,070 B2 | 9/2004 | Funaya et al. |
| 6,809,412 B1 | 10/2004 | Tourino et al. |
| 6,818,545 B2 | 11/2004 | Lee et al. |
| 6,822,324 B2 | 11/2004 | Tao et al. |
| 6,830,877 B2 | 12/2004 | Ma et al. |
| 6,849,916 B1 | 2/2005 | Glenn et al. |
| 6,870,259 B2 | 3/2005 | Silverbrook |
| 6,903,012 B2 | 6/2005 | Geefay et al. |
| 6,903,883 B2 | 6/2005 | Amanai |
| 6,933,616 B2 | 8/2005 | Fang |
| 6,940,158 B2 | 9/2005 | Haba et al. |
| 6,955,943 B2 | 10/2005 | Zakel et al. |
| 6,972,480 B2 | 12/2005 | Zilber et al. |
| 6,982,475 B1 | 1/2006 | MacIntyre |
| 6,995,462 B2 | 2/2006 | Bolken et al. |
| 7,033,664 B2 | 4/2006 | Zilber et al. |
| 7,164,199 B2 | 1/2007 | Tarn |
| 7,265,440 B2 | 9/2007 | Zilber et al. |
| 7,276,798 B2 | 10/2007 | Higashi et al. |
| 7,564,496 B2 | 7/2009 | Wolterink et al. |
| 7,754,537 B2 | 7/2010 | Haba et al. |
| 7,791,184 B2 | 9/2010 | Wood et al. |
| 2001/0005040 A1 | 6/2001 | Hong |
| 2001/0009300 A1 | 7/2001 | Sugimura |
| 2001/0013653 A1 | 8/2001 | Shoji |
| 2001/0033478 A1 | 10/2001 | Ortiz et al. |
| 2001/0042902 A1 | 11/2001 | Wakabayashi et al. |
| 2002/0000646 A1 | 1/2002 | Gooch et al. |
| 2002/0016024 A1 | 2/2002 | Thomas |
| 2002/0017699 A1 | 2/2002 | Shenoy |
| 2002/0056900 A1 | 5/2002 | Liu et al. |
| 2002/0074668 A1 | 6/2002 | Hofstee et al. |
| 2002/0089835 A1 | 7/2002 | Simmons |
| 2002/0090803 A1 | 7/2002 | Salaville |
| 2002/0102004 A1 | 8/2002 | Minervini |
| 2002/0159242 A1 | 10/2002 | Nakatani et al. |
| 2002/0170175 A1 | 11/2002 | Aigner et al. |
| 2002/0179696 A1 | 12/2002 | Pattanaik et al. |
| 2002/0195700 A1 | 12/2002 | Li |
| 2003/0001252 A1 | 1/2003 | Ku et al. |
| 2003/0017687 A1 | 1/2003 | Hembree |
| 2003/0025204 A1 | 2/2003 | Sakai |
| 2003/0038327 A1 | 2/2003 | Smith |
| 2003/0047797 A1 | 3/2003 | Kuan et al. |
| 2003/0052404 A1 | 3/2003 | Thomas |
| 2003/0067073 A1 | 4/2003 | Akram et al. |
| 2003/0077878 A1 | 4/2003 | Kumar et al. |
| 2003/0102540 A1 | 6/2003 | Lee |
| 2003/0133588 A1 | 7/2003 | Pedersen |
| 2003/0148578 A1 | 8/2003 | Ku et al. |
| 2003/0151139 A1 | 8/2003 | Kimura |
| 2003/0159276 A1 | 8/2003 | Wakefield |
| 2003/0168725 A1 | 9/2003 | Warner et al. |
| 2003/0211014 A1 | 11/2003 | Jacquorie et al. |
| 2003/0218283 A1 | 11/2003 | Yasumura et al. |
| 2004/0007774 A1 | 1/2004 | Crane, Jr. et al. |
| 2004/0029356 A1 | 2/2004 | Timme et al. |
| 2004/0041249 A1 | 3/2004 | Tsai et al. |
| 2004/0069758 A1 | 4/2004 | Azdasht et al. |
| 2004/0099917 A1 | 5/2004 | Greathouse et al. |
| 2004/0099938 A1 | 5/2004 | Kang et al. |
| 2004/0099958 A1 | 5/2004 | Schildgen et al. |
| 2004/0104261 A1 | 6/2004 | Sterrett et al. |
| 2004/0104470 A1 | 6/2004 | Bang et al. |
| 2004/0106294 A1 | 6/2004 | Lee et al. |
| 2004/0115866 A1 | 6/2004 | Bang et al. |
| 2004/0145054 A1 | 7/2004 | Bang et al. |
| 2004/0164981 A1 | 8/2004 | Fujita et al. |
| 2004/0166662 A1 | 8/2004 | Lei |
| 2004/0188124 A1 | 9/2004 | Stark |
| 2004/0217455 A1 | 11/2004 | Shiono et al. |
| 2004/0238931 A1 | 12/2004 | Haba et al. |
| 2004/0238934 A1 | 12/2004 | Warner et al. |
| 2004/0259325 A1 | 12/2004 | Gan |
| 2005/0017348 A1 | 1/2005 | Haba et al. |
| 2005/0042805 A1 | 2/2005 | Swenson et al. |
| 2005/0062135 A1 | 3/2005 | Tase et al. |
| 2005/0067681 A1 | 3/2005 | De Villeneuve et al. |
| 2005/0067688 A1 | 3/2005 | Humpston |
| 2005/0082653 A1 | 4/2005 | McWilliams et al. |
| 2005/0082654 A1 | 4/2005 | Humpston et al. |
| 2005/0085016 A1 | 4/2005 | McWilliams et al. |
| 2005/0087861 A1 | 4/2005 | Burtzlaff et al. |
| 2005/0095835 A1 | 5/2005 | Humpston et al. |
| 2005/0104179 A1 | 5/2005 | Zilber et al. |
| 2005/0116344 A1 | 6/2005 | Humpston |

(56) References Cited

U.S. PATENT DOCUMENTS

| | | | |
|---|---|---|---|
| 2005/0126472 A1 | 6/2005 | Popescu et al. | |
| 2005/0139984 A1 | 6/2005 | Tuckerman et al. | |
| 2005/0142685 A1 | 6/2005 | Ouellet et al. | |
| 2005/0167773 A1 | 8/2005 | Ozawa et al. | |
| 2005/0170656 A1 | 8/2005 | Nasiri et al. | |
| 2005/0189622 A1 | 9/2005 | Humpston et al. | |
| 2005/0189635 A1 | 9/2005 | Humpston et al. | |
| 2005/0205977 A1 | 9/2005 | Zilber et al. | |
| 2005/0236684 A1 | 10/2005 | Chen et al. | |
| 2005/0239235 A1* | 10/2005 | Appelt | H01L 21/481 438/118 |
| 2005/0248680 A1 | 11/2005 | Humpston | |
| 2005/0258518 A1 | 11/2005 | Yang et al. | |
| 2005/0279916 A1 | 12/2005 | Kang et al. | |
| 2006/0023108 A1 | 2/2006 | Watanabe et al. | |
| 2006/0044450 A1 | 3/2006 | Wolterink et al. | |
| 2006/0081983 A1 | 4/2006 | Humpston et al. | |
| 2006/0091488 A1 | 5/2006 | Kang | |
| 2006/0110854 A1 | 5/2006 | Horning et al. | |
| 2006/0141665 A1 | 6/2006 | Mohammed | |
| 2006/0166480 A1 | 7/2006 | Yun et al. | |
| 2006/0220234 A1 | 10/2006 | Honer et al. | |
| 2006/0278997 A1 | 12/2006 | Gibson et al. | |
| 2007/0042527 A1 | 2/2007 | Tuckerman et al. | |
| 2007/0138644 A1 | 6/2007 | McWilliams et al. | |
| 2007/0190691 A1* | 8/2007 | Humpston | B81C 1/00269 438/113 |

FOREIGN PATENT DOCUMENTS

| | | |
|---|---|---|
| EP | 0 828 346 | 3/1998 |
| EP | 1 071 126 A | 1/2001 |
| EP | 1 357 741 A | 10/2003 |
| GB | 2392555 | 3/2004 |
| JP | 5047620 | 2/1993 |
| JP | 07-202157 | 8/1995 |
| JP | 08-213874 A | 8/1996 |
| JP | 11-026782 A | 1/1999 |
| JP | 11-326366 | 11/1999 |
| JP | 2006-041277 A | 2/2006 |
| WO | 85/02283 | 5/1985 |
| WO | 8502283 | 5/1985 |
| WO | 89/04113 | 5/1989 |
| WO | 8904113 | 5/1989 |
| WO | 95/19645 | 7/1995 |
| WO | 96/14965 A1 | 5/1996 |
| WO | 97/11588 A1 | 3/1997 |
| WO | 02/058233 A | 7/2002 |
| WO | 2004/017399 | 2/2004 |
| WO | 2004017399 | 2/2004 |
| WO | 2004/023546 | 3/2004 |
| WO | 2004/025699 | 3/2004 |
| WO | 2004023546 | 3/2004 |
| WO | 2004025699 | 3/2004 |
| WO | 2004/027880 A | 4/2004 |
| WO | 2004027880 A2 | 4/2004 |

OTHER PUBLICATIONS

U.S. Appl. No. 11/204,680, filed Aug. 16, 2005, assigned to Tessera, Inc.

U.S. Appl. No. 11/284,289, filed Nov. 21, 2005, assigned to Tessera, Inc.

U.S. Appl. No. 11/300,900, filed Dec. 15, 2005, assigned to Tessera, Inc.

* cited by examiner

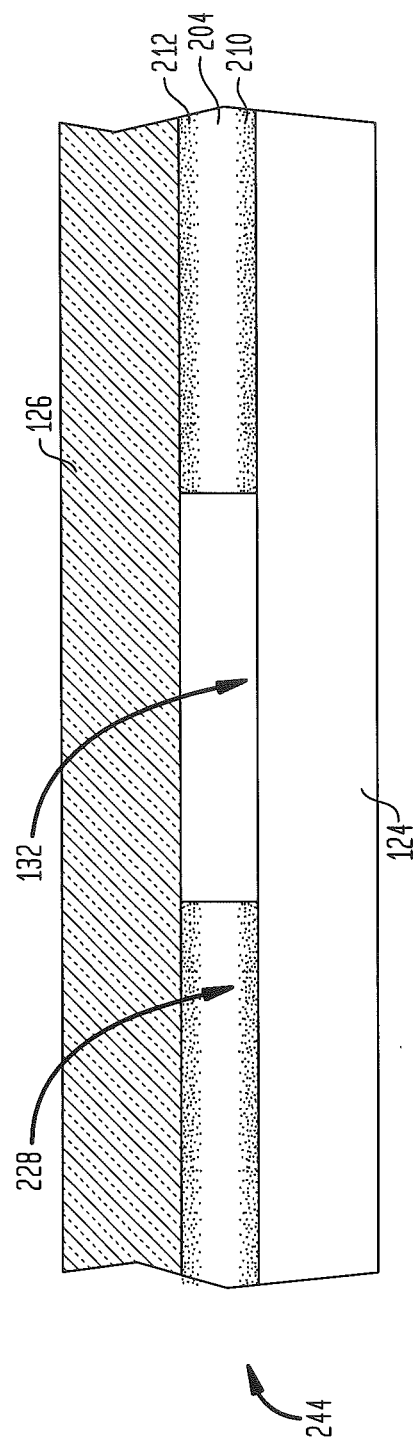

MICROELECTRONIC ASSEMBLY WITH MULTI-LAYER SUPPORT STRUCTURE

CROSS-REFERENCE TO RELATED APPLICATIONS

The present application is a divisional of U.S. patent application Ser. No. 11/650,356, filed Jan. 5, 2007 now U.S. Pat. No. 8,604,605, the disclosure of which is incorporated herein by reference.

FIELD OF THE INVENTION

This application relates to a microelectronic assembly and, more particularly, to a microelectronic assembly with a multi-layer support structure and a method of forming said microelectronic assembly.

BACKGROUND OF THE INVENTION

Microelectronic assemblies typically include a device with an active region thereupon. The active region typically is surrounded by a support structure. A lid is supported by the support structure and extends over the active region of the device.

The continual miniaturization of electronic assemblies in general has created continued demand to reduce the size of such microelectronic assemblies and to improve the methods of manufacturing such microelectronic devices.

SUMMARY OF THE INVENTION

In one aspect, a method of forming a microelectronic assembly is disclosed. The method includes positioning a support structure adjacent to an active region of a device but not extending onto the active region. The support structure has planar sections, with each planar section having a substantially uniform composition. The composition of at least one of the planar sections differs from the composition of at least one of the other planar sections. A lid is positioned in contact with the support structure and extending over the active region. The support structure is bonded to the device and to the lid.

In some implementations, the planar sections include first and second adhesive layers coupled to the device and to the lid, respectively. A structural layer is between the first and second adhesive layers. The structural layer is adapted to resist deformation under environmental conditions associated with bonding the first adhesive layer to the device and the second adhesive layer to the lid. In those implementations, the method also includes exposing the first and second adhesive layers to environmental conditions to cause the first and second adhesive layers to bond to the device and lid, respectively. In some instances, exposing the first and second adhesive layers to the environmental conditions includes exposing the first and second adhesive layers to a temperature and a pressure to cause the bonding. Typically, a vertically disposed edge of the structural layer borders the active region of the device. While the first and second adhesive layers are exposed to the bonding environmental conditions, the structural layer resists deformation over or into the active region. The structural layer's position between the two adhesive layers also restrains deformation of the adhesive layers.

In certain implementations, the support structure is formed by forming a multi-layered sheet of support structure material and punching the sheet to define one or more apertures having side walls that can border corresponding active regions.

In some instances, forming the multi-layered sheet of support structure material includes providing a structural layer having a first side and a second side opposite the first side, adhering a first adhesive layer to the first side of the structural layer and adhering a second adhesive layer to the second side of the structural layer.

In some instances, forming the multi-layered sheet of support structure material includes providing a sheet of material adapted to resist deformation under environmental conditions associated with bonding an adhesive material, forming a plurality of pores in opposite surfaces of the support structure and coating the porous surfaces with an adhesive material that seeps at least partially into the pores.

In some instances, forming the multi-layered sheet of support structure material includes providing an adhesive material and partially curing the adhesive material to define a section of the support structure adapted to resist deformation under environmental conditions associated with fully curing the adhesive material. According to some embodiments, the section of the support structure adapted to resist deformation is approximately midway between an upper surface and a lower surface of the support structure.

In certain embodiments, positioning the support structure includes aligning the aperture in the support structure so that the one or more side walls border the active region.

According to some implementations, the change in composition between the at least one planar section that differs from the composition of the at least one other planar section is gradual.

In some implementations, the disclosed method includes formulating the first adhesive layer with a first chemical makeup to facilitate bonding to the device; and formulating the second adhesive layer with a second chemical makeup that is different than the first chemical makeup to facilitate bonding to the lid.

In certain embodiments, the planar sections include first and second structural layers coupled to the device and the lid, respectively and an adhesive layer between the first and second structural layers. The first and second structural layers are adapted to resist deformation under environmental conditions suitable for bonding the first adhesive layer to the first and second structural layers. In those embodiments, the method further includes exposing the adhesive layer to the environmental conditions suitable for bonding the adhesive layer.

The active region typically is populated with one or more microelectronic devices, such as optical devices. When optical devices are used, the lid is typically substantially transparent to electromagnetic radiation at wavelengths that are relevant to the optical devices. The planar sections typically include at least one layer that is substantially opaque to radiation at a wavelength relevant to the one or more optical devices. In some embodiments, at least one substantially opaque layer is substantially non-reflective to the relevant wavelengths. In some implementations, the lid is glass.

In another aspect, a microelectronic assembly is disclosed that includes a device having an active region. A support structure with planar sections having substantially uniform compositions is adjacent to the active region but does not extend onto the active region. A lid is in contact with the support structure and extends over the active region. The support structure has planar sections with each planar section having a substantially uniform composition. The composition of at least one of the planar sections differs from the composition of at least one other of the planar sections.

In some instances, the planar sections include first and second adhesive layers coupled to the device and to the lid, respectively and a structural layer between the first and second adhesive layers. The structural layer is adapted to resist deformation under environmental conditions that are suitable to bond the first adhesive layer to the device and the second adhesive layer to the lid. The bonding environmental conditions typically include a pressure and a temperature suitable to bond the first adhesive layer to the device and the second adhesive layer to the lid.

According to some implementations, the first and second adhesive layers are specifically formulated to facilitate bonding to the device and to the lid, respectively. In certain embodiments, the structural layer is substantially opaque.

In some embodiments, the planar sections include first and second structural layers respectively coupled to the device and to the lid and an adhesive layer positioned between the first and second structural layers. The first and second structural layers are adapted to resist deformation under environmental conditions that are suitable for bonding the adhesive layer to the first and second structural layers.

Certain implementations of the assembly include an active region that is populated with one or more microelectronic devices. The one or more microelectronic devices can be one or more optical devices. In those instances, the lid typically is substantially transparent to electromagnetic radiation at a wavelength that is relevant to the one or more optical devices. For example, the lid can be glass. Typically, at least one of the planar sections is substantially opaque to radiation having wavelengths that are relevant to the one or more optical devices.

In some implementations, one or more of the following advantages are present.

The amount of deformation of a support structure during bonding can be reduced. Accordingly, the possibility that harm might occur from the support structure deforming into or over the active region of a microelectronic device is reduced. Additionally, since the possibility of harmful deformation is reduced, the support structure can be formed closer to the active region. As a result, microelectronic assemblies can be made smaller. Higher support structures can be formed without increasing the likelihood of damage from excessive deformation during bonding.

BRIEF DESCRIPTION OF THE DRAWINGS

FIG. 2 is a partial cross-sectional elevational view of a microelectronic assembly 244 in accordance with another embodiment of the invention.

Like reference numerals indicate like elements.

DETAILED DESCRIPTION

FIGS. 1A-1E are partial cross-sectional elevational views showing a method of forming a microelectronic assembly according to one embodiment of the invention. The illustrated method is adapted to be implemented as a wafer-level process. However, for simplicity sake, the figures show only a fragmentary view of the components undergoing that process.

Figure 1A:
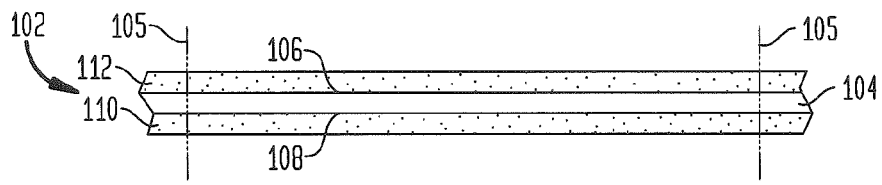
FIGS. 1A-1E are partial cross-sectional elevational views showing a method of forming a microelectronic assembly according to one embodiment of the invention.

Referring to FIG. 1A, the illustrated method includes forming a multi-layered sheet 102 of support structure material. The multi-layered sheet 102 is formed by providing a structural layer 104 having a first side 106 and a second side 108. The second side 108 is opposite the first side 106. A first adhesive layer 110 is adhered to the second side 108 of the structural layer 104. A second adhesive layer 112 is adhered to the first side 106 of the structural layer 104. The structural layer 104 includes a material that is adapted to resist deformation under environmental conditions (e.g., pressures and/or temperatures) that are suitable for bonding the first and second adhesive layers 110, 112. A variety of environmental conditions (e.g., ultraviolet radiation, etc.) may be suitable to facilitate bonding of the adhesive layers 110, 112 to external elements.

Certain dimensions of the elements shown in the figures are exaggerated for clarity sake. In a preferred embodiment, the vertical dimensions of the adhesive layers 110, 112 would be as small as practicable and the vertical dimension of the structural layer 104 would be significantly greater than the vertical dimensions of either adhesive layer 110, 112. Accordingly, in a typical implementation, the structural layer 104 would account for most of the height of the multi-layered sheet 102. Indeed, in most instances, each adhesive layer 110, 112 is only thick enough to provide a substantially continuous coating over the corresponding surface of the structural layer 104, taking into account surface irregularities. The ratio of thicknesses between layers in the multi-layered sheet typically is between about 1:2:1 and 1:500:1. More preferably, however, that ratio is approximately 1:40:1.

A pair of dicing lines 105 is shown in the figures. The dicing lines 105 identify where cuts will eventually be made to separate the wafer into individual microelectronic devices.

Figure 1B:
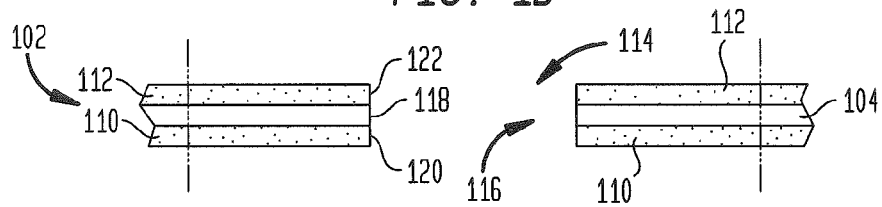

In FIG. 1B, the multi-layered sheet 102 is punched to form an aperture 114 that extends entirely through the structural layer 104, the first adhesive layer 110 and the second adhesive layer 112. The aperture 114 has side walls 116 that include exposed inner edges 118, 120, 122 of the structural layer 104 the first adhesive layer 110 and the second adhesive layer 112, respectively.

Figure 1C:
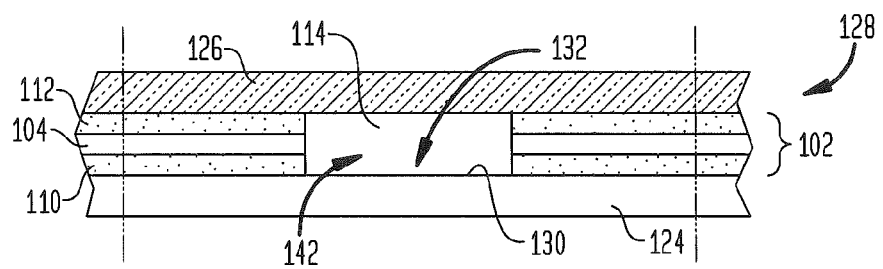

After the aperture 114 is formed, in FIG. 1C, the method includes positioning the punched multi-layered sheet 102 between a device wafer 124 and a lid wafer 126. The multi-layered sheet 102 acts as a support structure 128 for the lid wafer 126. In the illustrated embodiment, the device wafer 124 has an upper surface 130 with an active region 132 thereon. Microelectronic devices (e.g., optical devices) are exposed at the upper surface 130 in the active region 132. The punched, multi-layered sheet 102 is positioned so that the aperture 114 aligns with the active region 132. In that way, the support structure 128 borders the active region 132 but does not extend onto the active region 132.

The lid wafer 126 is in contact with the support structure 128 and extends over the active region 132. In optical microelectronic assemblies, the lid wafer 126 typically includes a material (e.g., glass, plastic, etc.) that is substantially transparent to radiation having a wavelength that is relevant to the optical devices exposed at the active region 132.

The device wafer 124, the support structure 128 and the lid wafer 126 together define a substantially empty cavity 142 around the active region 132. The term "substantially empty" should be construed to include cavities that are filled with air, gas or that are under vacuum. The cavity 142 is bordered on all sides by the support structure 128. The upper surface 130 of the device wafer 124 defines the bottom of each cavity 142. The lid wafer 126 extends over the area that is bordered by the support structure 128 and defines a top of each cavity 142. In a typical embodiment, the substantially empty cavity 142 is filled with a gas, such as air. However, in other embodiments, the substantially empty cavities could be under vacuum.

In the illustrated implementation, the first and second adhesive layers 110, 112 have different chemical formulations. More particularly, the first adhesive layer 110 is specifically formulated to facilitate bonding to the device wafer 124. Similarly, the second adhesive layer 112 is specifically formulated to facilitate bonding to the lid wafer 126. Generally, most adhesives are compatible with most materials. However, there are some exceptions. For example, epoxies generally bond poorly to chrome or plastics. Additionally, thermoplastics bond poorly to precious metals. Acrylics tend not to bond to rubber or polyethylene. Cyanoacrylates adhere poorly to many common materials. Accordingly, it is desirable to avoid using certain adhesive/material combinations. Providing separate adhesive layers 110, 112 facilitates customizing each adhesive layer for its intended application.

Figure 1D:
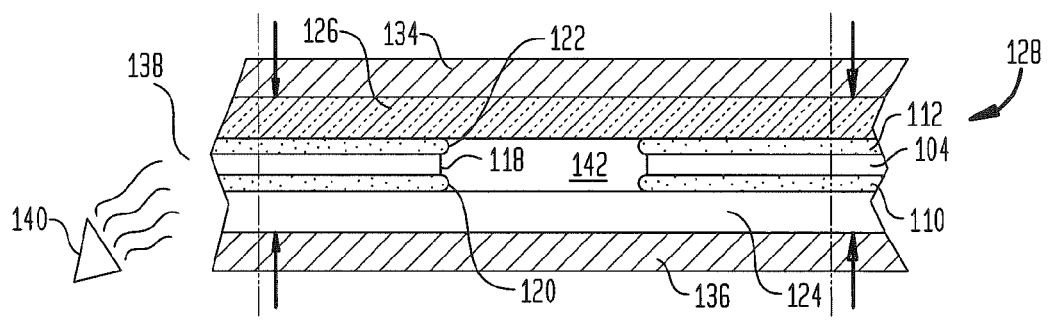

FIG. 1D shows the support structure 128 being bonded to the device wafer 124 and to the lid wafer 126. The illustrated bonding process includes exposing the first and second adhesive layers 110, 112 to appropriate environmental conditions (e.g., pressures and temperatures) so as to cause the first adhesive layer 110 to bond to the device wafer 124 and to cause the second adhesive layer 112 to bond to the lid wafer 126. In the illustrated embodiment, the entire assembly 138 (including the device wafer 124, the support structure 128 and the lid wafer 126) is positioned between a pair of pressure plates 134, 136 that are applying a compressive force to the assembly 138.

A heat source 140 is applying a suitable amount of heat to the assembly to increase the temperature of the adhesive layers 110, 112 to facilitate their bonding. The heat source 140 is shown as an external element. However, the heat source can be implemented in a number of ways. For example, the heat source could be integrated into one or both of the pressure plates.

During the bonding process, the applied pressure and temperature causes the first and second adhesive layers 110, 112 to deform. Accordingly, the inner edges 120, 122 of the first and second adhesive layers 110, 112 bulge into the cavity 142. Since the structural layer 104 is adapted to resist deformation under pressure and temperature conditions associated with the bonding process, the structural layer 104 substantially retains its shape during the bonding process. Accordingly, the inner edge 118 of the structural layer 104 does not substantially bulge or extend into the cavity 142 during bonding. Additionally, the presence of the structural layer 104 between the two adhesive layers 110, 112 tends to restrain the amount of bulging that each adhesive layer 110, 112 experiences. Accordingly, the support structure 128 can support the lid wafer 126 at a relatively large height above the device wafer 124 with relatively little bulging effect from the side walls 116 of the aperture 114.

In the illustrated implementation, the amount of bulging from the side walls 116 of the aperture 114 into the cavity 142 above the active region 132 is minimized. Accordingly, the aperture 114 can be formed so that its side walls 116 are closer to the active region 132 than might otherwise be feasible. Since the structural layer 104 substantially retains its shape during the bonding process and since adhesive layers 110, 112 are separated from each other by the structural layer 104, the possibility of the side walls 116 bulging onto or over the active region 132 in a harmful way is reduced.

Figure 1E:
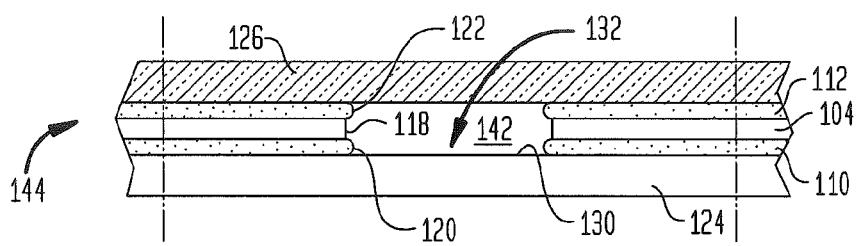

FIG. 1E shows a resulting microelectronic assembly 144. The illustrated microelectronic assembly 144 includes a device wafer 124 with active region 132. The device wafer 124 typically is a silicon integrated circuit. A support structure 128 is in contact with and bonded to the upper surface of the device wafer 124 and is disposed adjacent to the active region 132. The support structure 128 does not extend onto or over the active region 132, but is located very close to the active region 132. A lid wafer 126 is in contact with and bonded to the support structure 128 and extends over the active region 132.

In the illustrated embodiment, the support structure has essentially three planar sections—a first adhesive layer 110, a structural layer 104 and a second adhesive layer 112. Each planar section has a substantially uniform composition in a horizontal direction. However, the compositions of the structural layer 104, the first adhesive layer 110 and the second adhesive layer 112 differ from each other. The first adhesive layer 110 is a material that is formulated to facilitate bonding to the device wafer 124. The second adhesive layer 112 is a material that is formulated to facilitate bonding to the lid wafer 126. The structural layer 104 is adapted to resist deformation under temperature and pressure conditions that are suitable to bond the first adhesive layer 110 to the device wafer 124 and the second adhesive layer 112 to the lid wafer 126. In some instances, the first and second adhesive layers 110, 112 are substantially identical in composition.

The term "composition" as used herein should be construed broadly to include any structural or functional characteristic of a material. Such characteristics can include, for example, rigidity, chemical makeup, distribution of materials, density, viscosity, adhesiveness, etc. Furthermore, a substantially uniform composition does not require the complete absence of localized variations in a composition. Instead, a composition can be said to be substantially uniform even if it includes minor localized variations in a composition distributed throughout. For example, a composition that includes a porous first material, with a second material filling the pores can be considered substantially uniform if, for example, the filled pores are distributed throughout most of the composition. Additionally, the substantial uniformity of a planar section of material is not affected by the formation of an aperture through a section of the material.

The first and second adhesive layers 110, 112 are bonded to the device wafer 124 and to the lid wafer 126, respectively. The structural layer 104 is between the first and second adhesive layers 110, 112. The inner edges 120, 122 of the first and second adhesive layers 110, 112 are bulged slightly into the cavity 142 formed by the device wafer 124, the support structure 128 and the lid wafer 126. The inner edge 118 of the structural layer 104 is substantially straight (i.e., not bulged).

In certain implementations, the active region 132 is populated with one or more optical microelectronic devices. In those implementations, the lid wafer 126 is typically a material (e.g., glass) that is substantially transparent to electromagnetic radiation at a wavelength that is relevant to the one or more optical devices. In some embodiments, the lid wafer 126 includes one or more materials selected from glass, silicon, quartz and/or polymers, among others. The material composition of the lid wafer 126 can be adapted to filter particular spectral ranges (e.g., ultraviolet and/or infrared wavelengths). Certain embodiments include an anti-reflective coating on a surface of the lid wafer 126.

In some implementations, the structural layer 104 is substantially opaque to electromagnetic radiation at wavelengths that are relevant to optical devices in the active region 132. The substantially opaqueness can be provided by using an aluminum foil or other metal in the structural layer 104. Alternatively, the structural layer 104 could be infused with carbon black, a black pigment to provide an appropriate level of opaqueness.

FIG. 2 is a partial cross-sectional elevational view of a microelectronic assembly 244 in accordance with another embodiment of the invention.

The illustrated microelectronic assembly 244 is similar to the microelectronic assembly 144 shown in FIG. 1E except that the microelectronic assembly 244 of FIG. 2 has a support structure 228 with a composition that varies gradually in a vertical direction from the device wafer 124 to the lid wafer 126. The gradual variance in composition defines a first adhesive layer 210 that is in contact with the device wafer 124, a second adhesive layer 212 that is in contact with the lid wafer 126 and a structural layer 204 that is disposed between the first and second adhesive layers 210, 212. The structural layer 204 is adapted to resist deformation under temperature and pressure conditions associated with bonding the first and second adhesive layers 210, 212 to the device wafer 124 and to the lid wafer 126, respectively.

There are a number of ways that the illustrated support structure 228 can be formed. FIGS. 3A-3D are partial cross-sectional elevational views that illustrate an exemplary method of forming the support structure 228 shown in FIG. 2.

Figure 3A:
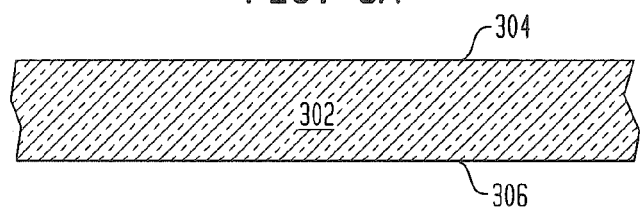
FIGS. 3A-3D are partial cross-sectional elevational views that illustrate an exemplary method of forming the support structure shown in FIG. 2.

According to FIG. 3A, a substantially planar sheet 302 of structurally rigid material is provided. Essentially, the structurally rigid material is adapted to resist deformation under environmental conditions associated with bonding certain adhesive materials. An example of the structurally rigid material is an extruded silica filler material in a polyamide matrix. The substantially planar sheet 302 has an upper surface 304 and a lower surface 306.

Figure 3B:
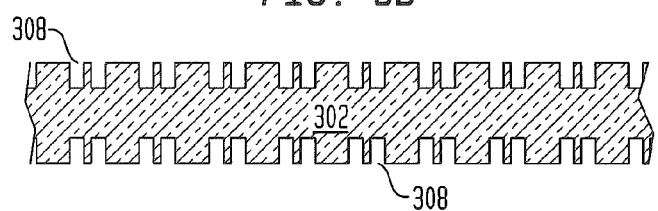

In FIG. 3B, the upper surface 304 and the lower surface 306 of the substantially planar sheet 302 are etched to form pores 308 in the upper and lower surfaces 304, 306. Typically, the pores are formed in a manner that ensures an approximately uniform porosity across each surface 304, 306. The pores typically extend into each surface 304, 306 a distance that is less than half the total height of the substantially planar sheet 302. The pores can be substantially cylindrical, tapered or can have a variety of other shapes. A number of techniques are suitable to form the pores 308.

Figure 3C:
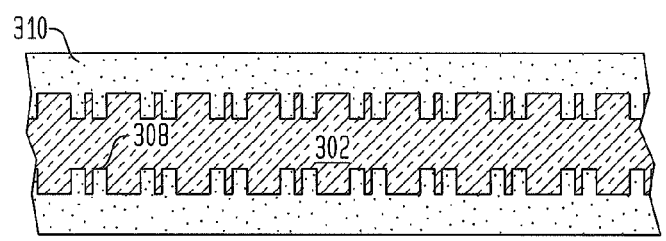

Subsequently, in FIG. 3C, an adhesive material 310 is applied to the upper and lower surfaces 304, 306 in a manner that enables the adhesive material 310 to seep at least partially into the pores 308 in the upper and lower surfaces 304, 306. In that way, a relatively large concentration of adhesive material 310 can be provided at the upper and lower surfaces 304, 306 of the substantially planar sheet 302 with a gradually lessening concentration of adhesive material 310 toward the center of the substantially planar sheet 302. Certain embodiments include virtually no adhesive material 310 at the center of the substantially planar sheet 302.

Figure 3D:
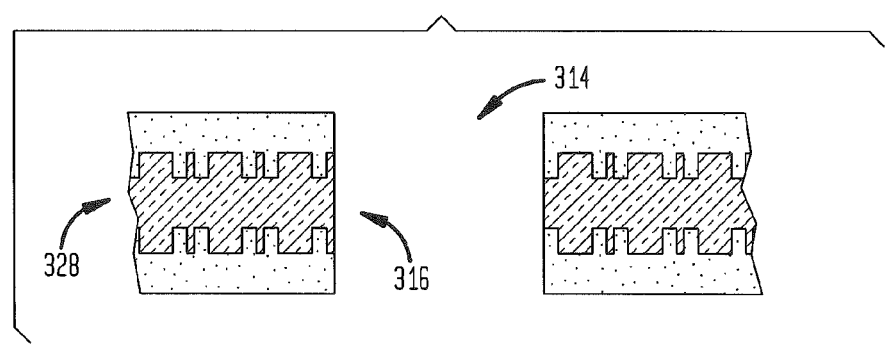

In FIG. 3D, an aperture 314 is formed in the support structure 328. In some implementations, the aperture 314 is formed by punching or otherwise cutting through the support structure material. The aperture 314 is formed with substantially flat side walls 316. The aperture 314 is sized so that when the support structure 328 is coupled to a device wafer 124, the side walls 316 border an active region 132 on the device wafer 124 very closely.

An alternative method of forming the support structure 228 of FIG. 2 is to provide an adhesive sheet with a center layer (i.e., the structural layer 204) that is more fully cured than the outer layers (i.e., adhesive layers 210, 212). Exposure to oxygen retards the ability of certain adhesive materials to cure. For example, the rate at which certain UV-curable (ultraviolet curable) adhesives can be set is sensitive to oxygen retardation. Therefore, exposure to oxygen can result in the edges of joints remaining wet well after the bulk of the adhesive has fully cured. As another example, anaerobic adhesives cure in the presence of metal ions and the absence of oxygen so, again, the presence of oxygen delays cure. Accordingly, if a sheet of such material is exposed to curing conditions in an oxygen atmosphere, then the center of the adhesive sheet would cure faster than the outer layers, because the outer layers would be exposed to oxygen.

Figure 4:
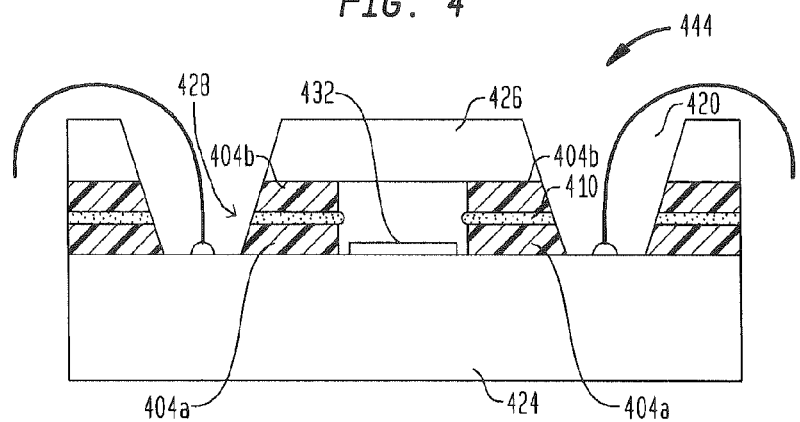
FIG. 4 is a partial cross-sectional elevational view of a microelectronic assembly according to another embodiment of the invention.

FIG. 4 is a partial cross-sectional elevational view of a microelectronic assembly 444 according to another embodiment of the invention.

The illustrated microelectronic assembly 444 is similar to the microelectronic assembly 144 shown in FIG. 1E except that the microelectronic assembly 444 of FIG. 4 includes a support structure 428 with a first structural layer 404a in direct contact with the device wafer 424, a second structural layer 404b in direct contact with the lid wafer 426 and an adhesive layer 410 between confronting faces of the first and second structural layers 404a, 404b. The first and second structural layers 404a, 404b are adapted to resist deformation under conditions associated with causing the adhesive layer 410 to bond. The microelectronic assembly 444 may have open areas 420 where the lid wafer 426 and the support structure 428 are open to the device wafer 424.

The illustrated first and second structural layers 404a, 404b can be formed in a number of ways. For example, in one implementation, the first and second structural layers 404a, 404b are formed by depositing and curing a flowable organic material (e.g., a curable polymer) in an appropriately shaped and dimensioned mold element. In some instances, the flowable organic material is molded to form sheets of structural layer material. An adhesive coating is applied to at least one surface of each sheet. The adhesive coating can be used to adhere one of the sheets to the device wafer 424 and the other of the sheets to the lid wafer 426. The adhesive coating can be applied with a roller to the surfaces of the sheets. In some implementations, the flowable organic material includes a polymer such as a photosensitive polymer which is curable by ultraviolet light ("UV settable polymer"). Alternatively, a photoresist or other selectively activatable polymer can be deposited onto the lid wafer and patterned to form the support structures 428.

Various other materials such as other polymers, glasses, especially low melting point glasses and frit glass, and fusible metallic materials such as solders, tin, and eutectic compositions and solder pastes can be used to form first and second support structures 428. Alternatively, the first and second support structures 428 can be manufactured by molding, etching, machining, pressing, etc., and then mounted between the lid wafer 426 and device wafer 424 with an adhesive. Other materials are suitable as well, including silicon or other semiconductors, metals, sol gels, glasses and ceramics.

An advantage of the structure illustrated in FIG. 4 is that the possibility of adhesive material expanding into or over the active region 432 during bonding is reduced.

Figure 5:
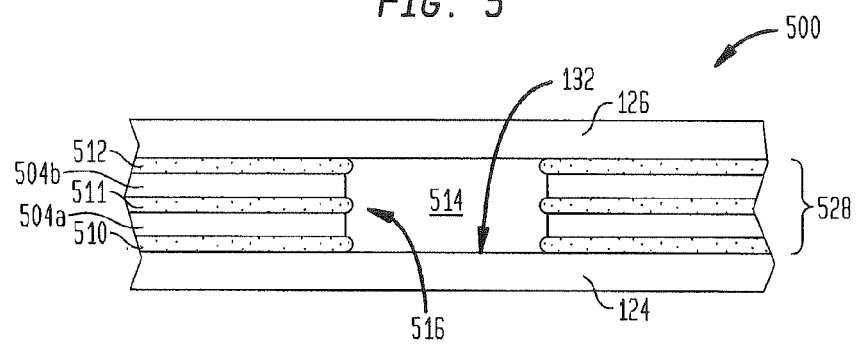
FIG. 5 is a partial cross-sectional elevational view of a microelectronic assembly according to yet another embodiment of the invention.

FIG. 5 is a partial cross-sectional elevational view of a microelectronic assembly 500 according to yet another embodiment of the invention.

The illustrated microelectronic assembly 500 is similar to the microelectronic assembly shown, for example, in FIG. 1E except the microelectronic assembly 500 includes a multi-layer support structure 528 with five distinct layers. Those layers include a first adhesive layer 510 in contact with the device wafer 124, a second adhesive layer 512 in contact with the lid wafer 126, a first structural layer 504a in contact with the first adhesive layer 510, a second structural layer 504b in contact with the second adhesive layer 512 and a middle adhesive layer 511 disposed between the first and second structural layers 504a, 504b.

An aperture 514 is formed through the multi-layer support structure 528. The aperture 514 has a side wall 516 that borders an active region 132 of the device wafer 124.

Although the illustrated implementation shows five distinct alternating adhesive and structural layers, it should be understood that any number of alternating adhesive and structural layers could be implemented. By increasing the number of layers, the height of the lid wafer 126 above the device wafer 124 can be increased without substantially increasing the possibility that harmful bulging from the side walls 516 of the aperture 514 into or above the active region 132 will occur.

Figure 6:
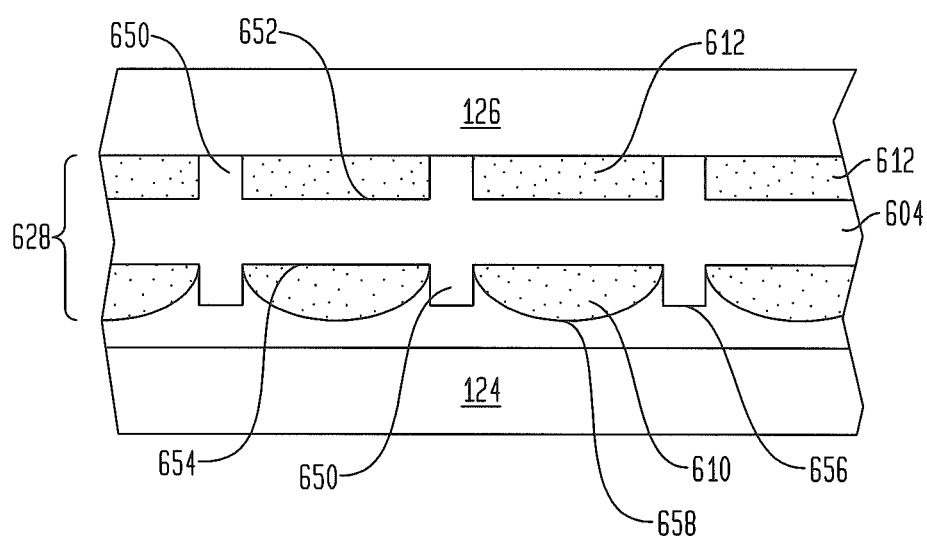
FIG. 6 is a partial cross-sectional elevational view of a microelectronic assembly being assembled according to yet another embodiment of the invention.

FIG. 6 is a partial cross-sectional elevational view of a microelectronic assembly being assembled according to yet another embodiment of the invention.

In the illustrated embodiment, the support structure 628 includes a structural portion 604 with protrusions 650 that extend from an upper surface 652 thereof and from a lower surface 654 thereof. The protrusions 650 can vary in shape, size and number. For example, in various implementations the protrusions can be pins, walls, curved surfaces, etc. The protrusions 650 can protrude a great or small distance. However, typically all of the protrusions 650 have approximately the same vertical dimension. There can be as few as three protrusions 650 or significantly more protrusions 650. The illustrated protrusions 650 have substantially flat, substantially coplanar distal ends 656. The structural portion 604 is adapted to resist deformation under environmental conditions associated with bonding and/or curing the adhesive material.

The illustrated support structure 628 also includes first and second adhesive portions 610, 612. Each adhesive portion 610, 612 is formed from adhesive material deposited in the spaces between the protrusions 650. In the illustrated implementation, the second adhesive layer 612 is in contact with the lid wafer 126. The distal ends 656 of the upward-extending protrusions 650 and the upper surface of the second adhesive portion 612 are substantially coplanar. Since the coplanar distal ends 656 of the protrusions 650 are in contact with the lower surface of the lid wafer 126, the illustrated arrangement helps ensure parallelism between the upper surface 652 of the structural portion 604 and the lid wafer 126. Generally, parallelism between those elements desirably helps to ensure uniform bulging of adhesive material around a perimeter of a cavity.

As shown, the first adhesive portion 610 is not yet in contact with the device wafer 124. The adhesive material is shown deposited between the downward-extending protrusions 650. The lower surface 658 of each deposit has an approximately dome-shaped profile with the portions of each deposit that are closest to the protrusions 650 extending the smallest distance from the lower surface 654 of the structural portion 604. Generally, the center of each dome extends from the lower surface 654 of the structural portion 604 beyond the plane that is defined by the distal ends 656 of the protrusions 650.

When the lower surface 658 of the first adhesive portion 610 is brought into contact with the device wafer 124, the lower surface 658 substantially flattens and forms a surface that is substantially coplanar with the distal ends 656 of the protrusions 650. When such contact is made, the distal ends 656 of the downward-facing protrusions 650 typically contact the upper surface of the device wafer 124. Such contact helps to ensure parallelism between the lower surface of the structural portion and the device wafer 124. Provided that the area of the distal tips 656 is small relative to the total joint area, good joint strength between the support structure 628 and the device wafer 124 can be achieved.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, the materials utilized to form the adhesive and structural layers can be varied considerably. Additionally, the materials of the device and the lid can be varied considerably. Additionally, the order of steps in the methods disclosed herein can be modified.

Some implementations include support structures having multiple alternating adhesive and structural layers. Such implementations might be desirable if, for example, the lid wafer 126 is to be positioned high above the upper surface of the device wafer 124.

A variety of techniques are possible for bonding the adhesive layers to the device and/or the lid. Such techniques can include, for example, exposing the adhesive layers to ultraviolet (UV) radiation for UV-curable adhesives and/or exposing the adhesive layers to other environmental conditions that cause water loss in the adhesive layers.

The techniques disclosed herein are typically implemented as a wafer-scale process. Accordingly, other steps, such as dicing, electrically coupling, etc. are usually implemented to prepare a complete microelectronic assembly. Also, the structural layers and corresponding adhesive layers are shaped to have substantially identical patterns.

Other implementations are within the scope of the following claims.

What is claimed is:

1. A method of forming a microelectronic assembly, comprising:

positioning a support structure adjacent to an active region of a device but not extending onto the active region, thereby positioning the support structure on a surface of the device, the support structure having a first adhesive layer for bonding with the surface of the device, and having a second adhesive layer facing away from the surface of the device, and a first structural layer between the first and second adhesive layers, positioning a second structural layer which projects from a major surface of a lid so that the second structural layer contacts the second adhesive layer and the lid extends over the active region of the device; and exposing the first and second adhesive layers to environmental conditions to cause the first and second adhesive layers to bond to the device and to the second structural layer, respectively, wherein the support structure and the second structural layer resist deformation under the environmental conditions associated with bonding the first and second adhesive layers to the device and the second structural layer, respectively.

2. The method of claim 1, wherein the support structure is a multi-layered sheet comprising the first and second adhesive layers and the first structural layer therebetween, the method further comprising punching the multi-layered sheet to define an aperture having one or more side walls adapted to border the active region prior to the positioning the support structure and the second structural layer relative to the device and prior to the exposing the first and second adhesive layers to the environmental conditions.

3. The method of claim 2 further comprising forming the multi-layered sheet of support structure material including:

providing a sheet of material which is capable of resisting deformation under environmental conditions associated with bonding an adhesive material;

forming a plurality of pores in opposite surfaces of the sheet to provide porous surfaces; and coating the porous surfaces with first and second adhesive layers, respectively, such that adhesive material of the adhesive layers seeps at least partially into the pores.

4. The method of claim 2 further comprising forming the multi-layered sheet of support structure material including:

providing an adhesive material; and partially curing the adhesive material to define a section of the support structure which is capable of resisting deformation under environmental conditions associated with fully curing the adhesive material, the section of the support structure that is capable of resisting deformation being the structural layer.

5. The method of claim 4 wherein the section of the support structure that is capable of resisting deformation is approximately midway between the device and the lid.

6. The method of claim 2 wherein positioning the support structure comprises aligning the aperture so that the one or more side walls border the active region.

* * * * *